(12) United States Patent
Syed et al.

(10) Patent No.: US 7,266,005 B2
(45) Date of Patent: Sep. 4, 2007

(54) EFFICIENT CONTENT ADDRESSABLE MEMORY ARRAY FOR CLASSLESS INTER-DOMAIN ROUTING

(75) Inventors: Danish Hasan Syed, Delhi (IN); Rajiv Kumar Yadav, Uttar Pradesh (IN); Anoop Khurana, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/321,794

(22) Filed: Dec. 29, 2005

(65) Prior Publication Data

US 2006/0155926 A1    Jul. 13, 2006

(30) Foreign Application Priority Data

Dec. 29, 2004   (IN)  .................................... 2594/04

(51) Int. Cl.
*G11C 27/00* (2006.01)

(52) U.S. Cl. .......................................... 365/49; 365/63

(58) Field of Classification Search ............... 365/49, 365/63

See application file for complete search history.

(56) References Cited

U.S. PATENT DOCUMENTS

| | | | |
|---|---|---|---|
| 6,505,270 B1 * | 1/2003 | Voelkel et al. ............... 711/108 |
| 6,904,057 B2 * | 6/2005 | Sarkinen et al. ............ 370/469 |
| 2005/0135135 A1 * | 6/2005 | Sharma et al. ................ 365/49 |

* cited by examiner

*Primary Examiner*—Michael T Tran
(74) *Attorney, Agent, or Firm*—Lisa K. Jorgenson; Allen, Dyer, Doppelt, Milbrath & Gilchrist, P.A.

(57) ABSTRACT

An efficient Content Addressable Memory array for Classless Inter-Domain Routing with each CAM cell including an additional storage unit for storing the prefix length associated with the contents of the cell. An enabling logic connects the prefix length value to a wired OR plane common to all CAM cells, and a sequential bit wise comparison unit has its inputs connected to the wired OR plane and the additional storage unit with its output controlling the enabling logic.

14 Claims, 5 Drawing Sheets

CAM gets multiple hits (shaded locations) but prioritizes according to the longest prefix.

Note: Prefix value 1-32 maps to 0-31 for 5-bit storage.

EFFICIENT CONTENT ADDRESSABLE MEMORY ARRAY FOR CLASSLESS INTER-DOMAIN ROUTING

FIELD OF THE INVENTION

The present invention provides an efficient Content Addressable Memory (CAM) array for Classless Inter-Domain Routing (CIDR).

BACKGROUND OF THE INVENTION

Content Addressable Memories (CAMs) are memories used to store and retrieve information based on comparison of a search key to contents of memory locations. Besides the means to fetch the input search key and means to deliver the output information about matched locations, each cell in a conventional CAM comprises a storage element to store and retrieve data and comparison circuitry to compare the search key data to the stored data. These conventional CAMs have been extensively used in routers for storing and retrieving Internet Protocol (IP) related information. However, the conventional CAMs require data to be stored in a particular order known as Table Management. Table management results in an additional burden in terms of time and resources on the router, as Table Management requires execution of time consuming tasks.

In Internet terminology, routing is the technique by which information finds its way from one networked computer to another. IPs are used to accomplish the task of routing by using IP addresses to communicate across any set of interconnected networks. These protocols are equally well suited for Local Area Network (LAN) and Wide Area Network (WAN) communications. There are several different addressing schemes that are being used on the Internet for IP address of a networked device. Most widely used IP version 4 (IPv4) addressing schemes use a 32-bit address and are known as IP version 4 (IPv4). The original IPv4 categorizes 32-bit addresses into three major classes of address structure, Classes A through C. In Class A addressing, the initial 8 bits represent the Network ID and the rest of 24 bits represent the Host ID. In Class B, 16 bits are used to represent the Network ID and rest represent the Host ID. In Class C 24 bits represent the Network-ID and 8 bits are used to define the Host ID. Using this addressing scheme, the Internet could support the following: 126 Class A networks that could include up to 16,777,214 hosts each along with 65,000 Class B networks that could include up to 65,534 hosts each, and over 2 million Class C networks that could include up to 254 hosts each.

While this addressing scheme has been tremendously popular, it has several drawbacks. Because Internet addresses were generally only assigned in three sizes, there were lots of wasted addresses. For example, if a company needs 100 IP addresses for its network, it would be assigned the Class closest to its requirement having smallest number of addresses (Class C), but that still meant 154 unused addresses, and if a company needed 300 addresses then it will be assigned a Class B address space, where out of 65536 addresses only 300 addresses would be used wasting 65236 addresses. This led to the near term exhaustion of Class B network address space. Another problem arose due to massive popularity and resultant growth of the Internet. As the Internet has grown, the number of networks on the Internet has increased rapidly and has resulted in the rapid growth in the size of the global Internet's routing table. Internet routers are fast approaching their limit on the number of routes they can support. Wasting of addresses and rapid growth along with the expandable nature of Internet throughout the world has led to concerns about exhaustion of Ipv4 addresses.

This concern has led to the development of a new scheme known as Classless Inter-Domain Routing (CIDR). This new scheme replaces the existing Classes with fixed bit length Network prefix with a variable length prefix. By accurately allocating only the amount of address space that was actually needed, the address space crisis could be avoided for many years. This was first proposed in 1992 as a scheme called Supernetting. Under supernetting, the classful subnet masks were extended so that a network address and subnet mask could, for example, specify multiple Class C subnets with one address. For example, If 1000 addresses are needed, 4 Class C networks are supernetted together:

| | | |
|---|---|---|
| 192.60.128.0 | (11000000.00111100.10000000.00000000) | Class C subnet address |
| 192.60.129.0 | (11000000.00111100.10000001.00000000) | Class C subnet address |
| 192.60.130.0 | (11000000.00111100.10000010.00000000) | Class C subnet address |
| 192.60.131.0 | (11000000.00111100.10000011.00000000) | Class C subnet address |
| 192.60.128.0 | (11000000.00111100.10000000.00000000) | Super-netted Subnet address |
| 255.255.252.0 | (11111111.11111111.11111100.00000000) | Subnet Mask |
| 192.60.131.255 | (11000000.00111100.10000011.11111111) | Broadcast address |

In this example, the subnet 192.60.128.0 includes all the addresses from 192.60.128.0 to 192.60.131.255. As you can see in the binary representation of the subnet mask, the Network portion of the address is 22 bits long, and the host portion is 10 bits long. Under CIDR, the subnet mask notation is reduced to simplified shorthand. Instead of spelling out the bits of the subnet mask, it is simply listed as the number of 1s bits that start the mask. In the above example, instead of writing the address and subnet mask as 192.60.128.0, Subnet Mask 255.255.252.0, the network address would be written simply as: 192.60.128.0/22. This indicates the starting address of the network, and number of 1s bits (22) in the network portion of the address. This notation works in binary (11111111.11111111.11111100.00000000).

The use of a CIDR notated address is the same as for a Classful address. Classful addresses can easily be written in CIDR notation (Class A=/8, Class B=/16, and Class C=/24)

| CIDR Block Prefix | # Equivalent Class C | # of Host Addresses |
|---|---|---|
| /27 | ⅛ th of a Class C | 32 hosts |
| /26 | ¼ th of a Class C | 64 hosts |
| /25 | ½ th of a Class C | 128 hosts |
| /24 | 1 Class C | 256 hosts |
| /23 | 2 Class C | 512 hosts |
| /22 | 4 Class C | 1024 hosts |
| /21 | 8 Class C | 2048 hosts |
| /20 | 16 Class C | 4096 hosts |
| /19 | 32 Class C | 8192 hosts |

-continued

| CIDR Block Prefix | # Equivalent Class C | # of Host Addresses |
| --- | --- | --- |
| /18 | 64 Class C | 16,384 hosts |
| /17 | 128 Class C | 32,768 hosts |
| /16 | 256 Class C | 65,536 hosts |
| /15 | 512 Class C | 131,072 hosts |
| /14 | 1,024 Class C | 262,144 hosts |
| /13 | 2,048 Class C | 524,288 hosts |

Many CIDR implementation schemes used currently arrange the IP addresses in a CAM such that the IP addresses with the longest prefix are stored in the location closest to the last location of the CAM. This technique is often referred to as Table Management, and is used because the CAM provides an output corresponding to the first encountered match result while checking from last memory location. These schemes require the user to ensure that the CAM stores the IP address with highest prefix length at the lowest address of the CAM.

In these implementations, the CAM is divided into blocks of different sizes such that a block at the lowest address of the CAM is allocated for the IP addresses with the longest prefix and subsequent blocks for second longest prefix and so on as shown in FIG. 1. This requirement, of storing data in particular blocks, places a significant burden on the router in terms of allocation process. For instance, if an IP address is to be located in a block with no empty cell then an empty cell has to be created by increasing the size of that block by searching for an empty cell in the nearest blocks. Once an empty cell is found, to create an empty cell in the desired block, the top most element of the block with the empty cell has to be shifted to the empty cell, creating an empty cell at the top. Subsequent blocks then have to be resized to include the new empty cell, the process being repeated until an empty cell is created in the desired block to store IP address as shown in FIG. 2. This exercise is both cumbersome and time consuming and can sometimes result in resizing of the entire CAM.

U.S. Pat. No. 6,237,061 describes a method for finding longest prefix match, which requires Table Management. Further a U.S. Pat. No. 6,460,112 describes a method and device for CIDR without requiring table management and allowing CAM to be arbitrarily loaded with CIDR addresses into the CAM device. This patent requires two internal searches to be conducted, the location having success in these two searches is the one having a matching entry with longest prefix. First search is on data word to find longest prefix among the hit locations, second is on mask (prefix) word to find entries with that longest mask. Only one location will succeed in both searches and will drive ROM (Priority Encoder) word-line. In this patent, prefix logic circuits determine the longest prefix among the CAM locations that matches the search key, regardless of where the matching locations are located in the CAM array. Once prefix is known it then searches which location has that prefix through prefix match-lines. This patent has additional hardware than the conventional CAM array, as both data and mask bit have compare logic. Thus both have comparand bit-lines, match-lines and data lines. It also has a prefix-logic (2-input NAND gate) with each data and mask bit. Also operation can't be pipelined until the time both searches are completed for maximum throughput. Thus, the time for searching next CIDR address would require considerable amount of time.

A co-pending Indian application 1319/Del/2003 also describes a method and device for CIDR with zero table management. This invention provides a Content Addressable Memory (CAM) with an improved priority encoder enabling random storage of CIDR IP addresses in memory. This encoder uses a counter, which is incremented starting from the value of zero. At every increment, the value stored in the counter is simultaneously compared with the prefix of all match locations and the index of the match location is stored by overwriting the previous stored value associated with a lower counter value. As a result at the end of count, only one match location is left.

While this is certainly an improvement over the prior art, the approach still has some redundancies. While a simultaneous comparison is performed for all hit locations, the matched locations with lower prefix values than the stored value of the counter are not eliminated from the comparison process. The aforementioned drawback also results in unnecessary comparison after the longest prefix has been found as the process continues until the counter reaches it's maximum value. It is seen that the CAM takes $2^N$ clock cycles, for a CAM with a N bit counter to count from 0 to $2^N-1$, and additional Read operation time to retrieve indices from a Read-Only Memory. Therefore, there is a need for more efficient CAMs, which result in faster searches for CIDR.

SUMMARY OF THE INVENTION

The present invention relates to improving conventional CAMs in routing applications by using a CAM requiring no Table Management. This improved scheme of storing data is known as Zero Table Management (ZTM). In Zero Table Management, the entries are stored in next free address (NFA). Further, the modified scheme provides means for selecting a single matched location with the longest prefix among the multiple match locations. The scheme results in desired output regardless of the location of the output in the CAM. The invention is explained in relation to the routing in conventional IP addressing scheme (IP version 4).

To obviate the above mentioned drawbacks an object of the present invention is to provide an efficient Content Addressable Memory array for Classless Inter-Domain Routing.

A further object of the invention is to provide an improved CAM removing the requirement for the table management resulting in a more efficient implementation.

Another object of the invention is a CAM array, which results in faster searches for CIDR implementation.

To achieve these and other objects the instant invention provides an efficient Content Addressable Memory array for Classless Inter-Domain Routing with each CAM cell comprising: an additional storage means or unit for storing the prefix length associated with the contents of the cell; an enabling logic for connecting the prefix length value to a wired OR plane common to all CAM cells; and a sequential bit wise comparison means or unit having its inputs connected to the wired OR plane and the additional storage means with its output controlling the enabling logic.

The enabling logic comprises a first logic gate receiving control signals, and plurality of buffers receiving enable signal from the logic gate, each buffer being connected to a corresponding output tap of the additional storage means. The sequential bit wise comparison means or unit comprises a plurality of comparators receiving the output of the wired OR plane and output taps of the additional storage means, a shift register for generating a walking one pattern, a plurality of logic gates, each logic gate connected to output of the shift register and output of corresponding comparator, a second logic gate receiving output of the plurality of logic gates; a third logic gate receiving output of the second logic gate, and a multiplexer connected to the output of the third logic gate and providing a feedback to the third logic gate.

The first logic gate may be an AND gate and second logic gate may be an OR gate. The third logic gate may be an AND gate. The plurality of logic gates may be AND gates.

The invention also provides an efficient method for detecting the largest prefix value among hit locations in a Content Addressable Memory array comprising storing the prefix length associated with the contents of the cell, connecting the prefix length value to a wired OR plane common to all CAM cells, and comparing the value of the stored prefix length with the value on the wired OR plane commencing from most significant bit and controlling the connection of the prefix length value at the start of comparison and disconnecting the prefix length value in case of a mismatch, thereby providing largest prefix value at the end of the sequential bit wise comparisons.

BRIEF DESCRIPTION OF THE DRAWINGS

The invention will now be described with reference to the accompanying drawings.

DETAILED DESCRIPTION OF THE PREFERRED EMBODIMENTS

Figure 1:
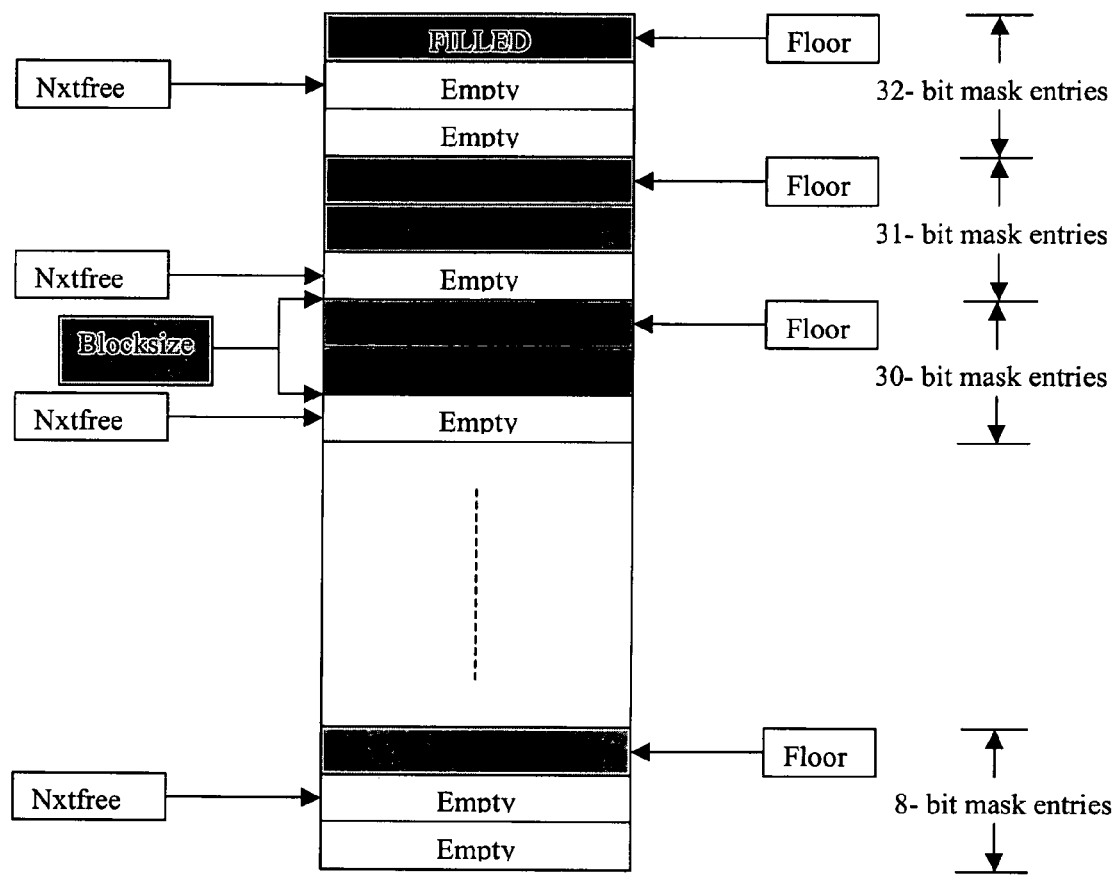
FIG. 1 is a block diagram showing a prior art CAM array partitioned into blocks.
Figure 2:
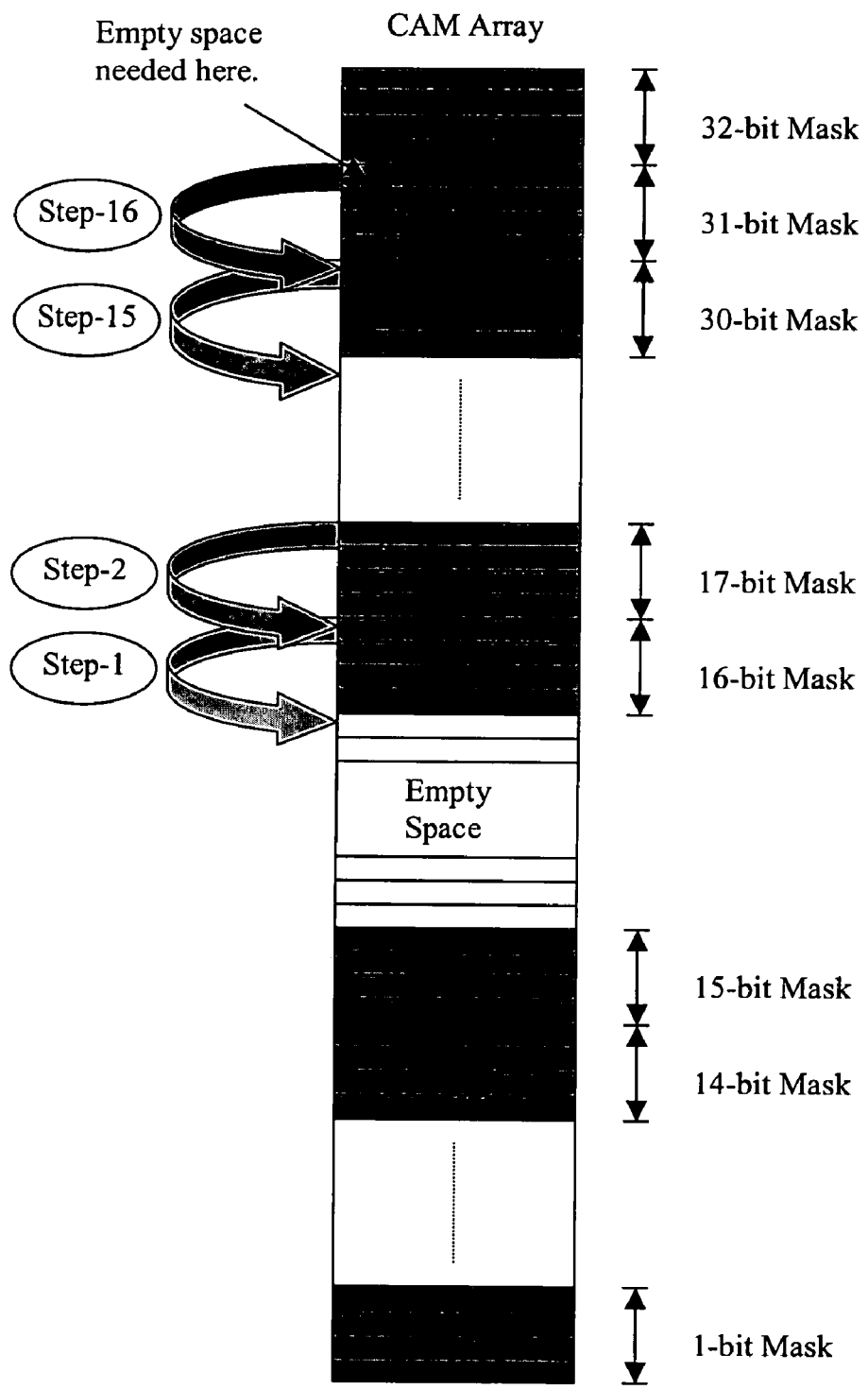
FIG. 2 is a schematic diagram illustrating the steps to create empty space for a new entry having 32 bit prefix/mask in the CAM array of FIG. 1.
Figure 3:
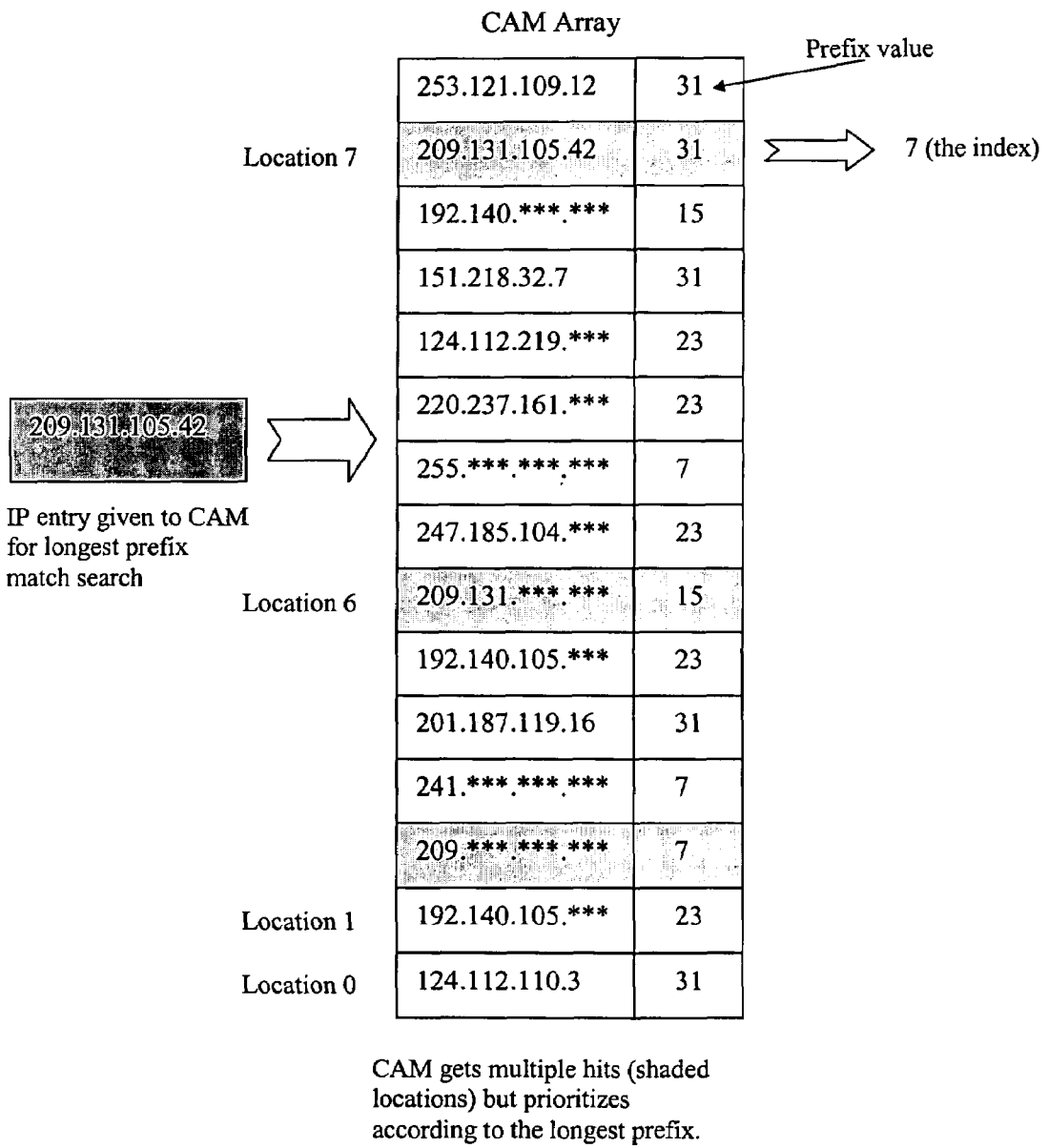
FIG. 3 is a diagram showing the longest prefix match process.
Figure 4:
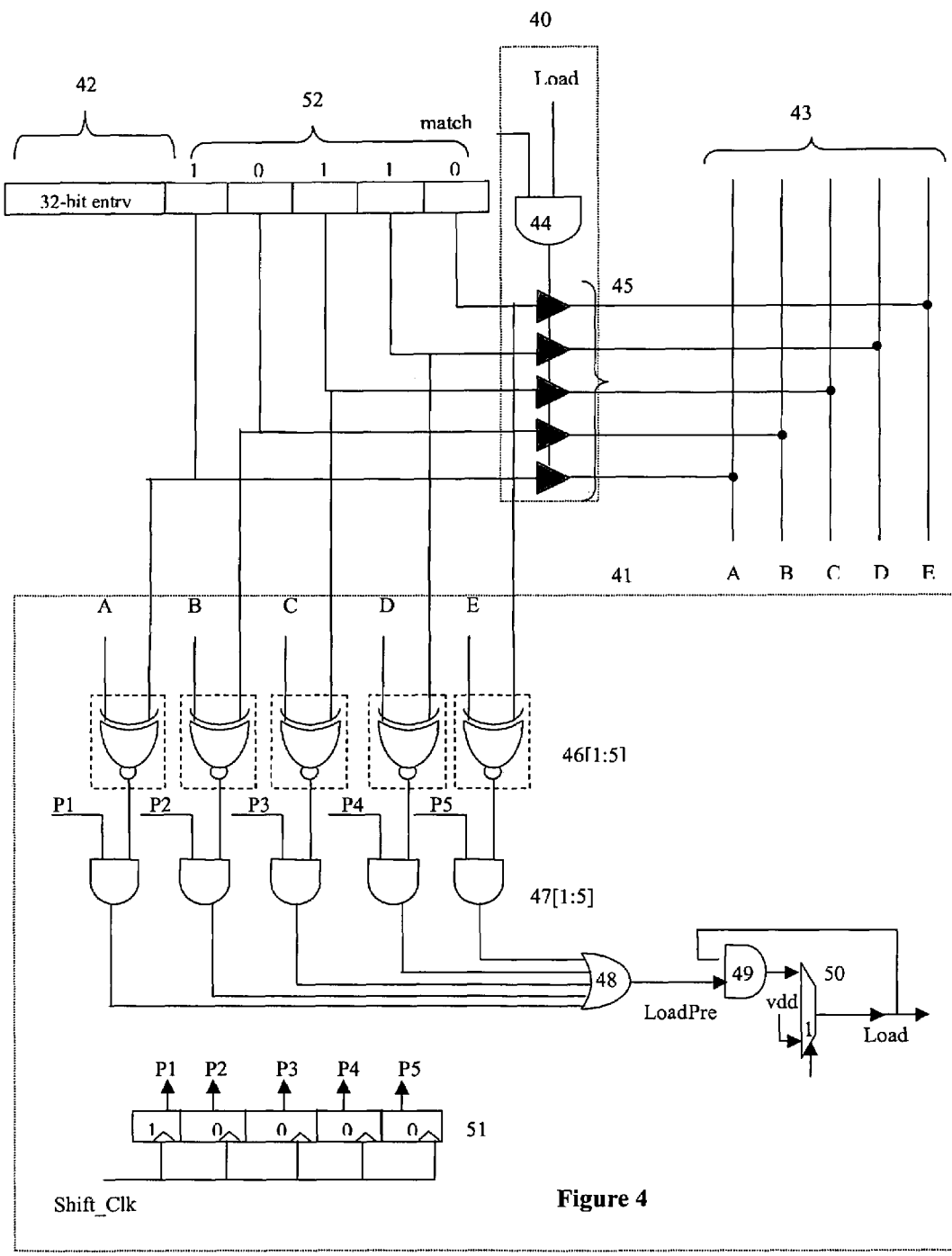
FIG. 4 is a schematic diagram showing the CIDR hardware for ZTM added to every location for doing CIDR in a CAM in accordance with the invention.

The present invention provides an improved CAM array for CIDR removing the requirement for the table management. This results in a faster search for the longest prefix length. FIG. 4 shows the Classless Inter-Domain Routing (CIDR) hardware requiring zero table management added to every location in a CAM. The figure illustrates the invention for the case of the 32-bit IPv4 address and hence a 5-bit prefix length memory and a corresponding 5-bit OR-plane are used in the figure. However, the architecture can be generalized for an N bit prefix length for $2^N$ length address depending on the user requirements.

In addition to the conventional CAM cell, the figure discloses an additional memory 52 whose stored values are connected to the enable logic 40 and the comparison logic block 41. The enable logic block 40 also receives the match signal from the associated CAM cell 42 and an enable signal from the comparison logic block 41 and has its outputs connected to the wired OR-plane 43 common to all CAM cells. The additional memory 52 is used to store the prefix length value associated with the stored data in CAM cell 42 and is thus called prefix length memory 52.

The enable logic 40 comprises an AND gate 44 receiving the match signal and the enable signal and a set of tristate buffers 45 receiving the output from the AND gate 44 and the individual bits from the prefix length memory 52. The comparison logic block 41 has a set of XNOR gates 46[1:5] each connected to a separate AND gate 47[1:5]. The output of AND gates 47[1:5] is connected to an OR gate 48. The output of the OR gate 48 is connected to an AND gate 49 which is further connected to a multiplexer 50. The output of the multiplexer 50 is fed back to the AND gate 49 connected to the multiplexer 50 and is also used as the enable input signal for the enable logic block 40.

In addition to the data received from the prefix length memory 52, the XNOR gates 46[1:5] in the comparison logic block 41 also receive the output of wired OR-plane denoted by A-E. The set of AND gates 47[1:5] receiving outputs of XNOR gates 46[1:5] also receive 5-bit data denoted by P1-P5, from a shift register 51 as the other input.

The other input of multiplexer 50 is connected to the supply. At the time of initialization, the control of the multiplexer 50 receives a pulse signal and this result in generation of a high enable signal for all CAM locations 42. Therefore, if both match signal and the enable signal are high for a location, the tristate buffers 45 in the enable block 40 are activated, driving the prefix on the OR-plane 43. Hence, at initialization, the enable logic block 40 is used to drive the prefix of all match locations on the OR-plane 43. After initialization, the comparison logic block 41 at each location is used to bitwise compare the wired OR-plane 43 values (A-E) to the stored prefix length value. The comparison logic block 41 changes the enable signal to low if the bitwise comparison fails resulting in disconnection of that particular prefix from the OR-plane 43. Hence, the enable signal is used to withdraw prefix length values from the OR-plane 43 through sequential bit comparison in the comparison logic block 41.

The bitwise comparison is done sequentially starting from the most significant bit (MSB). MSB of stored prefix is first compared with the MSB of OR-Plane (A) result using the corresponding XNOR gate 46 and, if they match then the output is high. This output signal is fed into the connected AND gate 47 that receives a walking 1 pattern starting from P1 from the shift register on its other input. As only the MSB of shift register (P1) is high initially and all others (P2-P5) are low, the output of all AND gates except the AND gate 47[1] connected to P1 are low. As a result, the output of the 5-bit OR gate 48 connected to the output of all AND gates is high only when the comparison of A with the MSB of stored prefix value results in a high.

The enable signal follows the output of OR gate 48 and the enable block 40 withdraws the prefix length value from the OR-plane 43 if the enable signal goes low. As enable signal goes low only when a mismatch occurs in the bit comparison, all match locations where the MSB comparison fails are disconnected from the OR-plane 43. Feedback of the enable signal to the AND gate 49 connected to the multiplexer 50 ensures that once enable signal goes low it remains low for entire operation. Thus a mismatch at any instant of comparison implies that there is another entry having a greater prefix, so this entry stops driving the OR-plane 43 for further shifts of the shift block. The walking 1 pattern in shift block is used to perform sequential bit comparison and more entries are withdrawn from the OR-Plane 43 after each shift and compare operation. At the end of sequential bit comparison a single entry is obtained and its prefix length drives the wired OR plane 43. This is the longest prefix length entry and it takes five clock cycles for five-bit prefix length to derive this result. This is significantly faster search than any prior art.

There can be many circuit embodiments for implementation of the explained method. The method employed is that an OR-plane is driven by prefixes and compare operation is performed in 5 cycles. A person skilled in the art can easily realize that shift and compare logic can be implemented in an area efficient manner with NMOS and PMOS transistors. This invention covers all such embodiments.

Figure 5:
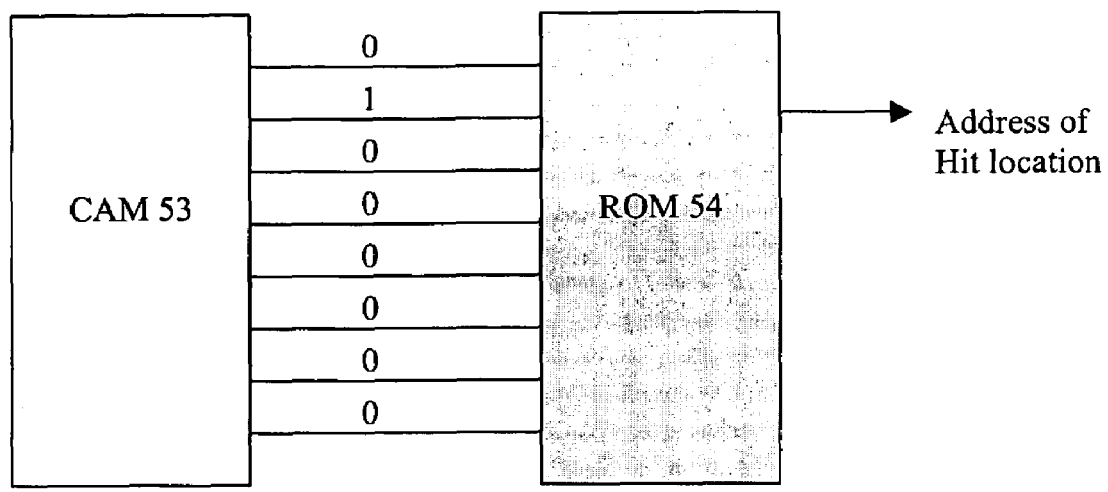
FIG. 5 is a block diagram showing the output from the CAM connected to a ROM in accordance with the invention.

After completion of the five shifts there will be a single location driving the ROM word-line. The enable signal from the CAM 53 can be fed into the ROM 54 as an output as shown in FIG. 5. Subsequently, address from the ROM 54 indicates the location of entry that has the longest prefix.

This is only one implementation of the invention. One can also do M bit sequential comparison with the same technique to enhance operation's performance. In this instance, the number of clock cycles for longest prefix search is reduced at the cost of extra hardware in comparison logic block. For example for a two bit comparator, the number of clock cycles are reduced by one for five bit wide prefix length memory i.e. now it would take four clock cycles instead of five to get longest prefix entry. In such implementation, the XNOR gate in the comparison logic block can be replaced by some modified structure. This invention covers all such embodiments.

That which is claimed is:

1. A Content Addressable Memory (CAM) array for Classless Inter-Domain Routing (CIDR), the CAM array comprising:
   a plurality of CAM cells;
   a wired OR plane connecting the plurality of CAM cells;
   a prefix length memory associated with each CAM cell to store a prefix length value associated with contents of the CAM cell and comprising a respective output tap for each bit of the prefix length value;
   an enabling circuit connecting the prefix length memory to the wired OR plane common to all CAM cells and comprising
      a first logic gate receiving control signals, and
      a plurality of buffers receiving an enable signal from the first logic gate, each buffer being connected to a corresponding output tap of the prefix length memory; and
   a sequential bit-wise comparison unit having inputs connected to the wired OR plans and the prefix length memory, and an output controlling the enabling circuit.

2. The CAM array as claimed in claim 1 wherein the sequential bit wise comparison unit further comprises:
   a plurality of comparators connected to an output of the wired OR plane and output taps of the prefix length memory;
   a shift register for generating a walking one pattern;
   a plurality of logic gates, each logic gate connected to an output of the shift register and an output of a corresponding comparator;
   a second logic gate receiving an output of the plurality of logic gates;
   a third logic gate receiving en output of the second logic gate; and
   a multiplexer connected to the output of the third logic gate and providing a feedback to the third logic gate.

3. The CAM as claimed in claim 1 wherein the first logic gate comprises an AND gate.

4. The CAM as claimed in claim 2 wherein the second logic gate comprises an OR gate.

5. The CAM as claimed in claim 2 wherein the third logic gate comprises an AND gate.

6. The CAM as claimed in claim 2 wherein the plurality of logic gates are AND gates.

7. A Content Addressable Memory (CAM) array comprising:
   a plurality of CAM cells;
   a logic device connecting the plurality of CAM cells;
   a prefix length memory associated with each CAM cell to store a prefix length value associated with contents of the CAM cell and comprising a respective output tap for each bit of the prefix length value;
   an enabling circuit connecting the prefix length memory to the logic device and comprising
      a first logic gate receiving control signals, and
      a plurality of buffers receiving an enable signal from the first logic gate, each buffer being connected to a corresponding output tap of the prefix length memory; and
   a comparison unit having inputs connected to the logic device and the prefix length memory, and an output controlling the enabling circuit.

8. The CAM array as claimed in claim 7 wherein the comparison unit further comprises:
   a plurality of comparators connected to an output of the logic device and output taps of the prefix length memory;
   a shift register;
   a plurality of logic gates, each logic gate connected to an output of the shift register and an output of a corresponding comparator;
   a second logic gate receiving an output of the plurality of logic gates:
   a third logic gate receiving an output of the second logic gate; and
   a multiplexer connected to the output of the third logic gate and providing a feedback to the third logic gate.

9. A method for detecting a largest prefix length value among hit locations in a Content Addressable Memory (CAM) array including a plurality of CAM cells connected together via a logic device, the method comprising:
   storing, in a prefix length memory, a prefix length value associated with the contents of a respective CAM cell, the prefix length memory comprising a respective output tap for each bit of the prefix length value;
   selectively connecting the prefix length memory to the logic device common to all CAM cells; and
   comparing the stored prefix length value with a value on the logic device beginning from a most significant bit and disconnecting the prefix length memory based upon the comparison to provide the largest prefix length value;
   wherein an enabling circuit selectively connects the prefix length memory to the logic device; and a comparison unit having inputs connected to the logic device and the prefix length memory, and an output controlling the enabling circuit, the comparison unit comparing the stored prefix length value with the value on the logic device
   the enabling circuit comprising
      a first logic gate receiving control signals, and
      plurality of buffers receiving an enable signal from the first logic gate, each buffer being connected to a corresponding output tap of the prefix length memory.

10. The method as claimed in claim 9, wherein the logic device comprises a wired OR plane.

11. The method as claimed in claim 9 wherein the comparison unit further comprises:

a plurality of comparators connected to an output of the logic device and output taps of the prefix length memory;

a shift register;

a plurality of logic gates, each logic gate connected to an output the shift register and an output of a corresponding comparator;

a second logic gate receiving an output of the plurality of logic gates;

a third logic gate receiving an output of the second logic gate; and a multiplexer connected to the output of the third logic gate and providing a feedback to the third logic gate.

12. A Content Addressable Memory (CAM) array comprising:

a plurality of CAM cells;

a logic device connecting the plurality of CAM cells;

a prefix length memory associated with each CAM cell to store a prefix length value associated with contents of the CAM cell;

an enabling circuit connecting the prefix length memory to the logic devices a comparison unit comprising inputs connected to the logic device and the prefix length memory, an output controlling the enabling circuit, a plurality of comparators connected to an output of the logic device and output taps of the prefix length memory, a shift register, a plurality of logic gates, each logic gate connected to, an output of the shift register and an output of a corresponding comparator, a second logic gate receiving an output of the plurality of logic gates, a third; logic gate receiving an output of the second logic gate, and a multiplexer connected to the output of the third logic gate and providing a feedback to the third logic gate.

13. The CAM as claimed in claim 12 wherein the second logic gate comprises an OR gate.

14. The CAM as claimed in claim 12 wherein the third logic gate comprises an AND gate.

* * * * *

UNITED STATES PATENT AND TRADEMARK OFFICE
CERTIFICATE OF CORRECTION

PATENT NO. : 7,266,005 B2
APPLICATION NO. : 11/321794
DATED : September 4, 2007
INVENTOR(S) : Syed et al.

Page 1 of 1

It is certified that error appears in the above-identified patent and that said Letters Patent is hereby corrected as shown below:

| | |
|---|---|
| Column 7, Line 42 | Delete: "plans" <br> Insert: -- plane -- |
| Column 7, Line 56 | Delete: "en" <br> Insert: -- an -- |
| Column 9, Line 22 | Delete: "devices" <br> Insert: -- device; -- |
| Column 10, Line 8 | Delete: "to," <br> Insert: -- to -- |
| Column 10, Line 14 | Delete: "third;" <br> Insert: -- third -- |

Signed and Sealed this

Twentieth Day of May, 2008

JON W. DUDAS
*Director of the United States Patent and Trademark Office*